TRANSMISSION LINE MOUNTING STRUCTURE FOR SEMICONDUCTOR DEVICE

Filed June 1, 1964

THOMAS B. HUTCHINS IV
JEAN F. DeLORD
WILLIAM C. MYERS
INVENTORS.
BY
BUCKHORN, BLORE, KLARQUIST & SPARKMAN
ATTORNEYS

United States Patent Office 3,308,352
Patented Mar. 7, 1967

3,308,352

TRANSMISSION LINE MOUNTING STRUCTURE FOR SEMICONDUCTOR DEVICE

Thomas B. Hutchins IV, Beaverton, Jean F. Delord, Portland, and William C. Myers, Hillsboro, Oreg., assignors to Tektronix, Inc., Beaverton, Oreg., a corporation of Oregon Filed June 1, 1964, Ser. No. 371,585
6 Claims. (Cl. 317—234)

The subject matter of the present invention relates generally to mounting structures or packages for high frequency semiconductor devices such as diodes or transistors, and in particular to a mounting structure which substantially eliminates the external shunt capacitance previously produced between the input and output terminals of the semiconductor device by conventional mounting structures, so that high frequency input signals are not transmitted around the semiconductor device through such shunt capacitance. The present mounting structure also prevents wave form distortion of input signals applied to a diode contained within the mounting structure due to signal reflections from the end of a transmission line connected to such diode, by incorporating a termination resistor having a resistance equal to the characteristic impedance of such line within the mounting structure to position such resistor immediately adjacent the diode.

The mounting structure of the present invention is especially useful when employed to mount the diodes of a diode bridge type sampling gate used in a sampling cathode ray oscilloscope. The sampling gate is normally biased nonconducting and is rendered briefly conducting by applying narrow interrogating pulses to such gate to take samples of different portions of successive wave forms of a repetitive high frequency input signal applied to the input of such gate and to transmit such sample signal portion from the output of such gate to a memory circuit in order to reproduce the wave form of such input signal as an output signal of a much lower frequency. A sampling system having such a sampling gate is disclosed in copending U.S. patent application, Serial No. 192,806, now Patent No. 3,248,655 entitled "Ratchet Memory Circuit," filed May 7, 1962 by John R. Kobbe et al.

Briefly, one embodiment of the mounting structure of the present invention includes a printed circuit board having a pair of conductor strips coated on the opposite sides thereof and a ground plane provided within the board between the conductor strips insulatingly spaced therefrom so that such ground plane extends parallel to such conductor strips and forms a pair of transmission lines therewith. An aperture is provided through the printed circuit board at the output end of one and the input end of the other of such transmission lines. A diode is mounted within the aperture with the input terminal of such diode connected to the output end of one of the conductor strips and with the output terminal of the diode connected to the input end of the other conductor strip. The ground plane extends up to the periphery of the aperture and surrounds the diode at a position approximately midway between the input and output end terminals of such diode, so that the external capacitance of the diode mount exists between such ground plane and the end terminals of the diode and forms part of the characteristic impedance of each of the two transmission lines. In addition, a termination resistor is supported within the aperture in the form of a cylindrical sleeve of resistance material surrounding the diode and connected between the ground plane and the output end of such one conductor strip. The termination resistor terminates the output end of the transmission line to which it is connected immediately adjacent the diode in the characteristic impedance of such line in order to prevent signal reflections from such output end which would otherwise be caused by the variable impedance of the diode.

It is therefore one object of the present invention to provide an improved mounting structure for a semiconductor device which substantially eliminates the external shunt capacitance previously produced between the input and output terminals of such device.

Another object of the invention is to provide an improved mounting structure for a high frequency semiconductor device which prevents wave form distortion of input signals applied to such device due to signal reflections from such device and capacitive coupling of a portion of the input signal around the device between the input and output terminals of such device.

A further object of the present invention is to provide a mounting structure for a diode in which a ground plane is employed between the input and output terminals of such diode to effectively eliminate any external shunt capacitance between the input and output terminals of such diode.

An additional object of the invention is to provide an improved mounting structure for the diodes of a sampling gate of a sampling oscilloscope in which a pair of termination resistors are employed within the mounting structure immediately adjacent each of a pair of input diodes of such sampling gate in order to prevent signal reflections from the ends of transmission lines connected to such input diodes.

Still another object of the present invention is to provide an improved mounting structure for a diode which is simple and inexpensive in construction and which increases the high frequency signal response of such diode.

Other objects and advantages of the present invention will be apparent from the following detailed description of a preferred embodiment thereof, and from the attached drawings of which:

Figures 1, 2:
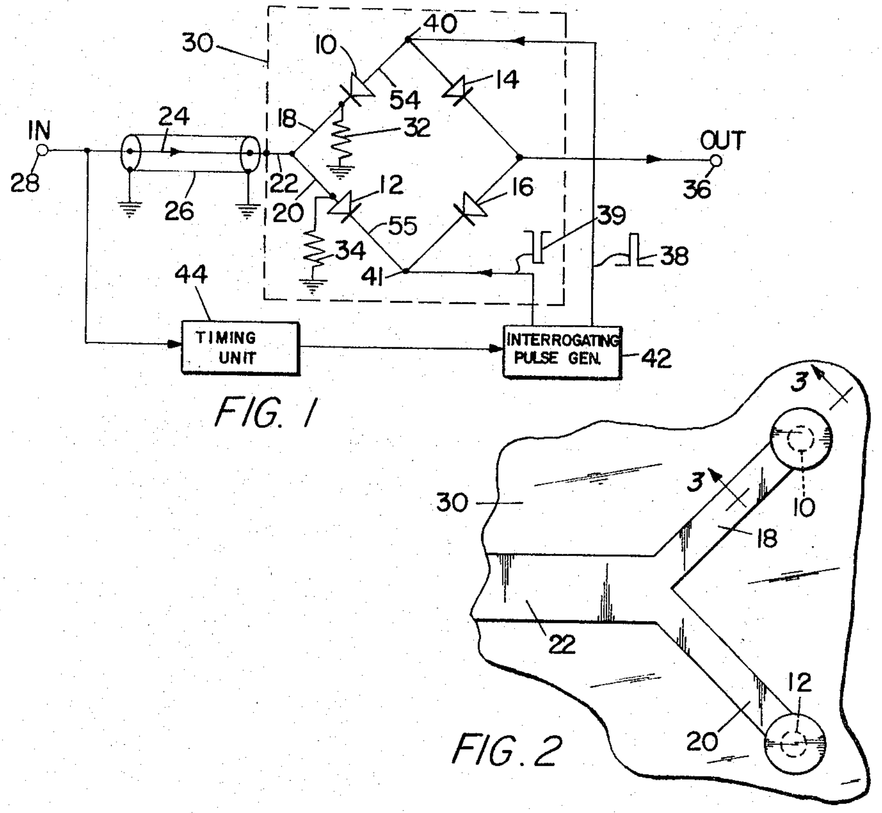
FIG. 1 is a schematic diagram of a portion of a sampling circuit employing a diode bridge as its sampling gate.
FIG. 2 shows a plan view of a portion of the mounting structure employed to support the diodes of the sampling gate of FIG. 1.

As shown in FIG. 1, one embodiment of the mounting structure of the present invention may be employed to mount four diodes 10, 12, 14 and 16 connected as a diode bridge type of sampling gate used in the signal sampling circuit of a sampling oscilloscope. The cathode of input diode 10 and the anode of input diode 12 are connected through conductor strips 18 and 20, respectively, and a common conductor strip 22 to the output end of an inner signal conductor 24 of a coaxial cable transmission line so that such diodes provide a bipolar gate. The coaxial cable may have a characteristic impedance of 50 ohms and has an outer shield conductor 26 connected to ground. The input end of the signal conductor 24 is connected to an input terminal 28 and the repetitive high frequency input signal to be sampled is applied to such input terminal. The conductor strips 18, 20 and 22 are coated on one side of an insulated support plate, such as a printed circuit board 30, which is indicated by dashed lines in FIG. 1. The common conductor strip 22 forms a transmission line having a characteristic impedance of 50 ohms, to match that of the coaxial cable 24, with a ground plane conductor provided by the printed circuit board in a manner hereafter described. Similarly conductor strips 18 and 20 also form transmission lines with the ground plane conductor of the printed circuit board, but the characteristic impedance of each of such lines is 100 ohms so that parallel impedance of these lines matches the characteristic impedance of the line formed by the common conductor strip 22. A pair of termination resistors 32 and 34 are connected, respectively, between the cathode of diode 10 and ground and between the anode of diode 12 and ground, in order to terminate the transmission lines including conductors 18 and 20 with a resistance equal to the characteristic impedance of such lines. Thus termination resistors 32 and 34 prevent signal reflections from the output ends of conductors 18 and 20 connected to diodes 10 and 12 which would otherwise be produced due to the high impedance of such diodes relative to the characteristic impedance of the transmission lines. In order to more effectively prevent signal reflections from the input diodes, the termination resistors 32 and 34 are supported immediately adjacent the diodes 10 and 12, respectively by positioning them within the mounting structure for such diodes in a manner hereafter described with reference to FIG. 3.

The cathode of output diode 14 and the anode of output diode 16 of the sampling gate are connected together to an output terminal 36 in order to transmit a sample portion of the input signal applied to input terminal 28 through the sampling gate to such output terminal when such sampling gate is rendered conducting. The sampling gate is normally biased nonconducting and is rendered conducting by applying narrow fast rising interrogating pulses 38 and 39 of opposite voltage polarity to a side terminal 40 at the common connection of the anodes of diodes 10 and 14 and to a side terminal 41 at the common connection of the cathodes of diodes 12 and 16 by means of an interrogating pulse generator 42. The diodes of the sampling gate are reversely biased nonconducting by applying a D.C. bias voltage between the side terminals 40 and 41 of such gate from a source of bias voltage (not shown) so that the anodes of diodes 10 and 14 are negative with respect to the cathodes of diodes 12 and 16. The positive interrogating pulse 38 applied to side terminal 40 and the negative interrogating pulse 39 applied to side terminal 41 are of sufficient voltage to overcome the D.C. reverse bias voltage and to forward bias the diodes of the sampling gate for a brief period of time determined by the width of such interrogating pulses.

The interrogating pulse generator 42 is triggered by a trigger pulse transmitted from the output of a timing unit 44, and a portion of the repetitive input signal applied to input terminal 28 is transmitted to the timing unit in order to produce the trigger pulse so that such trigger pulse is related in time to such input signal. The timing unit 44 varies the time of production of the trigger pulse and the interrogating pulses 38 and 39 generated by such trigger pulse with respect to the input signal producing such trigger pulse so that successive trigger pulses and their related interrogating pulses correspond in time to different portions of the input signal wave form. In order to accomplish this, the timing unit may include a fast ramp generator and comparator circuit similar to that disclosed in copending U.S. patent application, Serial No. 201,457, entitled "Pulse Generator Circuit" filed on June 11, 1962 by John V. Rogers. As a result the sample pulses transmitted through the sampling gate to the output terminal 36, have voltages which correspond to that of different portions of the wave form of the repetitive high frequency input signal applied to input terminal 28. These sample pulses are then transmitted to a memory circuit (not shown) which is connected to output terminal 36 in another part of the sampling system which stores the sample pulses to produce a low frequency output voltage having a wave form similar to that of such input signal, in a manner described in copending U.S. patent application, Serial No. 192,806, previously referred to.

As shown in FIG. 2, the common conductor strip 22 is provided as a metal coating on the upper surface of the printed circuit board 30 with a width greater than the width of each of the conductor strips 18 and 20 also coated on such upper surface. Thus the characteristic impedance of the transmission line including such common conductor strip is approximately one-half the characteristic impedance of the transmission lines including conductor strips 18 and 20. The conductor strips 18 and 20 intersect each other at an angle of approximately 45° at the output end of the common strip conductor 22 and terminate at their other ends adjacent a different one of a pair of circular apertures provided through the printed circuit board within which the input diodes 10 and 12 are mounted in a manner hereafter described.

Figure 3:
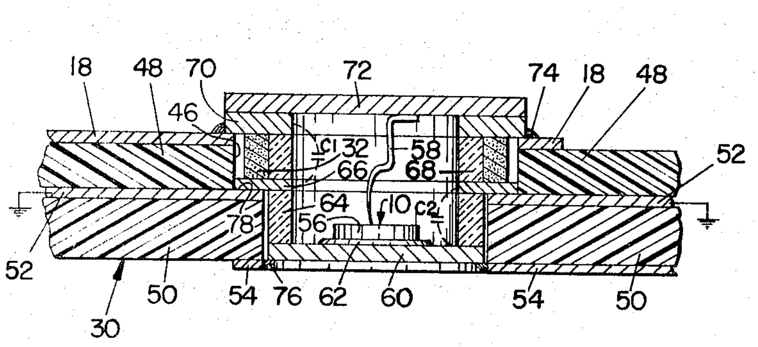
FIG. 3 is a section view taken along the line 3—3 of FIG. 2, showing the internal construction of the mounting structure on an enlarged scale.

As shown in FIG. 3, the input diode 10 is mounted within a circular aperture 46 which may extend completely through the printed circuit board 30, but may extend only partially through such board if desired. The printed circuit board 30 may be formed by a pair of insulating layers 48 and 50 of suitable plastic material having substantially uniform thicknesses and which are separated by a conducting layer 52 which extends substantially parallel to the outer surfaces of insulating layers 48 and 50. This conductive layer 52 is electrically connected to ground and functions as a common ground plane for the strip conductors 18, 20 and 22 provided on the outer surface of insulating layer 48 to form transmission lines therewith.

While it is not essential, the ground plane conductor 52 may also form additional transmission lines with other signal conductors provided on the lower side of the printed circuit board including output conductors 54 and 55 connected, respectively, to the anode of diode 10 and to the cathode of diode 12. Thus as shown in FIG. 3, an output conductor strip 54 similar to input conductor strip 18 may be provided on the outer surface of insulating layer 50 extending from a position immediately surrounding the aperture 46 in the printed circuit board. This output strip conductor 54 may be spaced from the ground plane conductor 52 by the same distance as input conductor strip 18 so that it forms a transmission line with such ground plane having a characteristic impedance equal to that of the transmission line formed by such input conductor strip.

The diode 10 may be a point contact diode formed by a body 56 of P or N type semiconductor material, such as gallium arsenide or silicon, and a spring wire 58 of metal whose sharpened point engages the surface of the semiconductor body to form a rectifying contact therewith. Of course, a PN junction diode, a transistor, or other semiconductor device can also be mounted in a similar manner. The semiconductor body 56 is attached to an output terminal plate 60 in the form of a circular, flat metal plate by soldering to form an annular solder connection 62 between such terminal plate and such semiconductor body. A first hollow cylindrical spacer sleeve 64 of ceramic material is suitably attached at one end thereof to the upper side of the output terminal plate 60 and at its other end to the lower side of a hollow circular metal ground ring 66. The other side of the ground ring 66 is secured to one end of a second hollow, cylindrical spacer sleeve 68 of ceramic material and the other end of such second spacer sleeve is secured to the lower side of a hollow circular metal disc 70. Thus, a cup-shaped support structure is formed by the members 60, 64, 66, 68 and 70, and the semiconductor body 56 is then soldered to the terminal plate 60 within the support cup. One end of the point contact wire 58 is rigidly attached to a circular metal cover plate 72 and the other end of such wire is urged into resilient engagement with the semiconductor body 56 by placing the cover plate onto the disc member 70. Next the cover plate is attached to the disc member 70 at the top of the support cup to form a hermetically sealed container for the diode, by brazing or the like. The covered support cup is then inserted into the aperture 46 from the upper side of the printed circuit board and the cover plate 72 is electrically connected to the input conductor strip 18 through the disc member 70 by soldering such disc member to the outer surface of such input conductor strip to form an annular solder connection 74 around the periphery at the upper end of the aperture 46. Thus the cover plate 72 functions as the input terminal member of the diode 10. In a like manner the output terminal plate 60 is also electrically connected to the output conductor strip 54 by an annular solder connection 76 around the periphery at the lower end of aperture 46.

The aperture 46 in the printed circuit board 30 may be formed by two cylindrical passageways of different diameter in order to provide an annular internal shoulder 78 within the aperture at the junction of such passageways. The shoulder is positioned approximately in the middle of the printed circuit board so that a portion of the ground plane 52 extends into the aperture and forms such shoulder. The ground ring 66 has an external flange portion which extends outwardly from the spacer sleeves 64 and 68 and such flange portion engages the ground plane 52 at the internal shoulder 78 within aperture 46. Thus the cup-shaped support structure including ground ring 66 is inserted through the upper end of the aperture 46 until the ground ring engages the ground plane conductor 52. The cup-shaped support structure is held in this position by exerting pressure on the cover plate 72 while the solder connections 74 and 76 are made in order to maintain such ground ring in mechanical contact with such ground plane conductor.

Before inserting the cup-shaped support structure within the aperture in the printed circuit board, the termination resistor 32 is clamped between the ground ring 66 and the disc member 70 so that it is electrically connected between the input terminal plate 72 of the diode and such ground ring. This termination resistor 32 may be in the form of a hollow cylindrical sleeve member of electrical resistance material surrounding the spacer sleeve 68. The termination resistor 32 has an inner diameter slightly greater than the outer diameter of spacer sleeve 68 and an outer diameter slightly less than the outer diameter of the ground ring 66, so that such termination resistor is spaced from the inner surface of the aperture 46 by sufficient distance to prevent direct electrical connection between the input conductor strip 18 and the side of such termination resistor.

By positioning the ground plane conductor 52 and the ground ring 66 approximately half way between the input terminal plate 72 and the output terminal plate 60 of the diode mounting structure, the shunt capacitance normally produced between such input and output terminal members is replaced by a pair of shunt capacitances $C_1$ and $C_2$ extending, respectively, between the ground ring 66 and the input and output terminal plates. As a result, any high frequency input signals applied to input conductor strip 18 which are transmitted around the diode 10 through the capacitance $C_1$ of the mounting structure, are transmitted to ground through the ground ring 66. In a similar manner any portion of the interrogating pulse 38 applied to the output conductor 54 which is transmitted around diode 10 through the capacitance $C_2$ of the mounting structure is also transmitted to ground through the ground ring. Therefore there is substantially no capacitive coupling of high frequency signals around the diode 10. In addition, the termination resistor 32 prevents any signal reflection from the output end of the transmission line including the input conductor strip 18 and thereby reduces wave form distortion of the input signal. A similar mounting structure is provided for diode 12.

The mounting structure of the present invention extends the range of the sampling gate considerably and enables the samples oscilloscope to reproduce repetitive input signals whose frequency is in the range of several hundred gigacycles per second ($10^{+9}$ c.p.s.). Of course output diodes 14 and 16 may be mounted in a similar manner to that of input diodes 10 and 12, except that termination resistors 32 and 34 can be eliminated. Also it is not necessary to provide transmission lines for the signal conductors connected to the anode of diode 10 and to the cathode of diode 12 and since the output conductor 54 need not be uniformly spaced from the ground plane 52, insulating layer 50 may be eliminated.

It will be obvious to those having ordinary skill in the art that many changes may be made in the details of the above described preferred embodiment of the present invention without departing from the spirit of the invention. Therefore the scope of the present invention should only be determined by the following claims.

We claim:

1. A high frequency gating device, comprising:

a support plate of insulating material having a pair of apertures therein;

a pair of semiconductor diodes quiescently biased nonconducting;

means for mounting said semiconductor diodes on said support plate within said apertures so that their input terminals are on one side of said support plate and their output terminals are on the other side of said support plate;

an input conductor strip coated on said one side of said support plate and connected in common to the anode of one and the cathode of the other of said diodes to provide a bipolar gate;

a pair of output conductor strips coated on said other said of said support plate and connected to the output terminals of different ones of said diodes;

a ground conductor within said support plate and extending in substantially uniform spacer relationship to said input and output conductors from a region adjacent said aperture approximately half way between said input and output terminals to form strip type transmission lines with said input and output conductors and to prevent capacitive coupling of high frequency signals around said semiconductor diodes between said input and output terminals; and a termination resistor provided in each aperture and connected between the input terminal of the diode in such aperture and said ground conductor, said resistor having a value equal to the characteristic impedance of the transmission line including said input conductor strip.

2. A high frequency sampling device, comprising:

a support plate of insulating material having a pair of apertures therein;

a pair of semiconductor diodes each having a gas tight housing and quiescently biased nonconducting;

an input conductor provided on one side of said support member and connected in common to the anode of one diode and to the cathode of the other diode to provide a bipolar sampling gate;

a pair of hollow annular termination resistors positioned outside of the diode housing;

means for mounting said diodes and said resistors on said support plate within said apertures so that each resistor surrounds a different one of said diodes and has one end connected to the input of its associated diode and with the input and output terminals of the diodes being positioned on opposite sides of said support plate; and a ground conductor secured to said support member and connected to the other end of said resistor, said ground conductor extending in substantially uniform spaced relationship to said input conductor from a region adjacent said aperture between said input and output terminals to form a strip type transmission line with said input conductor, said transmission line being terminated in its characteristic impedance by said resistor to prevent signal reflections and said ground conductor preventing capacitive coupling of high frequency signals around said semiconductor device.

3. Diode mount apparatus, comprising:
a support plate of insulating material having an aperture therein;
a gating diode supported on said support plate within said aperture and having an input terminal and an output terminal;
a ground ring of conducting material held within said aperture around said diode positioned approximately midway between said input and output terminals;
a pair of spacer sleeves of insulating material each having one end secured to said ground ring with said aperture on the opposite sides of said ground ring;
an input terminal member of metal connected to said input terminal of said diode and attached over the other end of one of said spacer sleeves to insulate said input terminal member from said ground ring;
an output terminal member of metal connected to said output terminal of said diode and secured over the other end of the other of said spacer sleeves to insulate said output terminal member from said ground ring and to form a hermetically sealed container for said diode with said spacer sleeves, said ground ring and said input terminal member;
an input conductor strip coated on one side of said support plate and connected to said input terminal member;
an output conductor connected to said output terminal member;
a ground conductor secured to said support plate substantially parallel to said input conductor strip and connected to said ground ring to form an input transmission line with said input strips; and
a termination resistor formed of a cylindrical sleeve of resistance material supported within said aperture outside of the diode container around said one spacer sleeve and connected between said input strip and said ground conductor, said resistor being of a value to terminate said input transmission line in its characteristic impedance.

4. Diode mount structure, comprising:
a gating diode having an input terminal and an output terminal;
a ground ring of metal supported around said diode positioned approximately midway between said input and output terminals;
a pair of spacer sleeves of ceramic material each having one end secured to said ground ring on the opposite sides of said ground ring;
an input terminal member of metal connected to said input terminal of said diode and attached over the other end of one of said spacer sleeves to insulate said input terminal member from said ground ring;
an annular resistor supported about said one spacer sleeve and connected between said input terminal member and said ground ring, such resistor having a resistance much greater than the forward conductor resistance of said diode; and
an output terminal member of metal connected to said output terminal of said diode and secured over the other end of the other of said spacer sleeves to insulate said output terminal member from said ground ring and to form a hermetically sealed container for said diode with said spacer sleeves, said ground ring and said input terminal member, said resistor being positioned outside of the diode container.

5. Diode sampling gate assembly, comprising:
a support plate of insulating material having a plurality of apertures therein;
a plurality of diodes each having an input terminal and an output terminal;
means for mounting said diodes within said apertures so that said input terminal is on one side of said support plate and said output terminal is on the other side of said support plate;
a common signal conductor coated on one side of said support plate;
a pair of input conductor strips coated on one side of said support plate, and connected between the output end of said common conductor and the input terminals of one pair of said diodes;
a pair of output conductors connected between the output terminals of said one pair of diodes and the input terminals of another pair of said diodes having their output terminals connected together;
a ground conductor attached to said support plate extending between said input and output terminals substantially parallel to said input conductors and said common conductor to form a common transmission line with said common conductor and a pair of branch transmission lines with said input conductors, said branch lines each having a characteristic impedance approximately twice that of said common line; and
a pair of termination resistors each supported in the aperture of a different one of said one pair of diodes and connected between said input conductor strips and said ground conductor, said resistors being of a value to terminate said branch lines in their characteristic impedance.

6. Diode bridge sampling gate assembly, comprising:
a support plate of insulating material having a plurality of apertures therein;
a plurality of diodes each supported on said support plate within one of said apertures and having an input terminal and an output terminal;
at least two ground rings of metal each positioned within a different one of said apertures around one of said diodes approximately midway between its input and output terminals;
at least two pairs of spacer sleeves of insulating material, each pair of sleeves being secured to the opposite sides of a different one of said ground rings;
at least two input terminal members of metal, each connected to the input terminal of a different one of the two diodes and attached to one sleeve of a different one of said pairs of spacer sleeves thereby being insulated from said ground rings;
at least two output terminal members of metal, each connected to the output terminal of a different one of said two diodes and secured to the other sleeve of a different one of said pairs of spacer sleeves thereby insulating said output members from said ground rings;
a common signal conductor strip coated on one said of said support plate;
a pair of input conductor strips coated on said one side of said support plate, each of said input strips having a width about one half that of said common strip and connected between the output end of said common strip and a different one of said input terminal members;
a pair of output conductors connected to said output terminal members;
a ground conductor attached to said support plate substantially parallel to said common strip and said input strips and connected to said ground rings to form a common transmission line with said common strip and a pair of branch transmission lines with said input strips, said branch lines having a characteristic impedance of approximately twice that of said common line;
a pair of termination resistors each formed of a cylindrical sleeve of resistance material having a resistance equal to the characteristic of said branch lines and supported within one of the apertures containing said ground rings, said resistors being connected between said input terminal members and said ground rings to terminate said branch transmission lines adjacent the diodes connected to said input terminal members.

References Cited by the Examiner

UNITED STATES PATENTS

| | | | |
|---|---|---|---|
| 3,119,030 | 1/1964 | Wine | 307—88.5 |
| 3,140,452 | 7/1964 | Schmitz et al. | 317—234 |
| 3,142,783 | 7/1964 | Warren | 333—84 |
| 3,209,284 | 9/1965 | Hast | 333—84 |
| 3,209,291 | 9/1965 | Schneider | 333—84 |

OTHER REFERENCES

Proc. of IRE, "A 5-Ampere Peak-Current Tunnel Diode Oscillator at VHF," February 1962, page 92.

IEEE Transaction on Electron Devices, "Measurement of Spot Noise of Esaki Diode," June 1964, page 276.

IBM Technical Disclosure Bulletin, "Tunnel Diode Memory Package," by Lawrence, December 1960, vol. 3, No. 7, page 29.

JOHN W. HUCKERT, *Primary Examiner.*

J. D. CRAIG, *Assistant Examiner.*